(12) United States Patent
Krippendorf et al.

(10) Patent No.: US 12,567,559 B2
(45) Date of Patent: Mar. 3, 2026

(54) ION IMPLANTATION DEVICE WITH ENERGY FILTER HAVING ADDITIONAL THERMAL ENERGY DISSIPATION SURFACE AREA

(71) Applicant: mi2-factory GmbH, Jena (DE)

(72) Inventors: Florian Krippendorf, Jena (DE); Constantin Csato, Jena (DE)

(73) Assignee: mi2-factory GmbH, Jena (DE)

( * ) Notice: Subject to any disclaimer, the term of this patent is extended or adjusted under 35 U.S.C. 154(b) by 453 days.

(21) Appl. No.: 17/925,343

(22) PCT Filed: Apr. 19, 2021

(86) PCT No.: PCT/EP2021/060116
§ 371 (c)(1),
(2) Date: Nov. 15, 2022

(87) PCT Pub. No.: WO2021/228500
PCT Pub. Date: Nov. 18, 2021

(65) Prior Publication Data
US 2023/0197404 A1      Jun. 22, 2023

(30) Foreign Application Priority Data

May 15, 2020    (LU) .................................. LU101807

(51) Int. Cl.
*H01J 37/317*          (2006.01)
(52) U.S. Cl.
CPC ..... *H01J 37/3171* (2013.01); *H01J 2237/002* (2013.01); *H01J 2237/057* (2013.01)

(58) Field of Classification Search
CPC ............. H01J 37/3171; H01J 2237/002; H01J 2237/057; H01J 2237/0475; H01J 2237/3171; G21K 1/10
See application file for complete search history.

(56) References Cited

U.S. PATENT DOCUMENTS

| | | | |
|---|---|---|---|
| 2003/0160189 A1 | 8/2003 | Matsuda | |
| 2006/0226372 A1 | 10/2006 | Yanagisawa et al. | |
| 2010/0264327 A1 | 10/2010 | Boenig et al. | |
| 2017/0059997 A1 | 3/2017 | Rupp et al. | |
| 2017/0352519 A1* | 12/2017 | Rupp ...................... | H01J 37/05 |

(Continued)

FOREIGN PATENT DOCUMENTS

| | | |
|---|---|---|
| DE | 10239312 | 3/2004 |
| DE | 102005061663 | 7/2007 |
| EP | 0014516 | 3/1983 |

(Continued)

OTHER PUBLICATIONS

International Search Report and the Written Opinion Dated Jul. 26, 2021 From the International Searching Authority Re. Application No. PCT/EP2021/060116. (16 Pages).

(Continued)

*Primary Examiner* — David E Smith

(57) ABSTRACT

An ion implantation device (20) comprising an energy filter (25), wherein the energy filter (25) has a thermal energy dissipation surface area, wherein the energy filter (25) comprises a membrane with a first surface and a second surface disposed opposite to the first surface, the first surface being a structured surface.

20 Claims, 4 Drawing Sheets

(56) References Cited

U.S. PATENT DOCUMENTS

| 2018/0068753 | A1 | | 3/2018 | Kamiguchi | |
| 2019/0122850 | A1 | * | 4/2019 | Krippendorf | ....... H01J 37/3172 |

FOREIGN PATENT DOCUMENTS

| EP | | 2239011 | | 10/2010 | | |
| JP | | 2007-075245 | | 3/2007 | | |
| JP | | 2007-523440 | | 8/2007 | | |
| JP | | 2019-522326 | | 8/2019 | | |
| WO | WO 2005/078758 | | | 8/2005 | | |
| WO | WO-2014132481 | A1 | * | 9/2014 | .......... | A61N 5/1077 |

OTHER PUBLICATIONS

Search Report and Written Opinion Dated Feb. 15, 2021 From Le Gouvernement du Grand-Duché de Luxembourg, Ministère de l'Économie Re. Application No. LU101807. (12 Pages).

* cited by examiner

ION IMPLANTATION DEVICE WITH ENERGY FILTER HAVING ADDITIONAL THERMAL ENERGY DISSIPATION SURFACE AREA

RELATED APPLICATIONS

This application is a National Phase of PCT Patent Application No. PCT/EP2021/060116 having International filing date of Apr. 19, 2021, which claims the benefit of priority of Luxembourg Patent Application No. LU 101807 filed on May 15, 2020. The contents of the above applications are all incorporated by reference as if fully set forth herein in their entirety.

FIELD AND BACKGROUND OF THE INVENTION

The invention relates to an apparatus for ion implantation device comprising an energy filter (implantation filter) for ion implantation and its use and to an implantation method.

Ion implantation is a method to achieve the doping or production of defect profiles in a material, such as semiconductor material or an optical material, with predefined depth profiles in the depth range of a few nanometers to several tens of micrometers. Examples of such semiconductor materials include, but are not limited to silicon, silicon carbide, gallium nitride. Examples of such optical materials include, but are not limited to, $LiNbO_3 \cdot Glas$, and PMMA.

There is a need to produce depth profiles for the ion implantation which have a wider depth distribution than that of a doping concentration peak or defect concentration peak obtainable by monoenergetic ion irradiation, or to produce doping or defect depth profiles which cannot be produced by one or a few simple monoenergetic implantations. Prior art methods are known for producing the depth profile use a structured energy filter in which the energy of a monoenergetic ion beam is modified as the monoenergetic ion beam passes through a micro-structured energy filter component. The resulting energy distribution leads to a creation of the depth profile ions the material. This is described, for example, in European Patent Nr. 0 014 516 B1 (Bartko) or U.S. Patent Application No. US 2019/122 850 A1.

An example of such an ion implantation device 20 is shown in FIG. 1 in which an ion beam 10 impacts a structured energy filter 25. The ion beam source 5 could also be a cyclotron, a tandem accelerator, or a single-ended-electrostatic accelerator. In other aspects, the energy of the ion beam source 5 is between 0.5 and 3.0 MeV/nucleon or preferably between 1.0 and 2.0 MeV/nucleon. In one specific aspect, the ion beam source produces an ion beam 10 with an energy of between 1.3 and 1.7 MeV/nucleon. The total energy of the ion beam 10 is between 1 and 50 MeV, in one preferred aspect, between 4 and 40 MeV, and in a preferred aspect between 8 and 30 MeV. The frequency of the ion beam 10 could be between 1 Hz and 2 kH, for example between 3 Hz and 500 Hz and, in one aspect, between 7 Hz and 200 Hz. The ion beam 10 could also be a continuous ion beam 10. Examples of the ions in the ion beam 10 include, but are not limited to aluminum, nitrogen, hydrogen, helium, boron, phosphorous, carbon, arsenic, and vanadium.

In FIG. 1 it will be seen that the energy filter 25 is made from a membrane having a triangular cross-sectional form on the right-hand side, but this type of form is not limiting of the invention and other cross-sectional forms could be used. The upper ion beam 10-1 passes through the energy filter 25 with little reduction in energy because the area $25_{min}$ through which the upper ion beam 10-1 passes through the energy filter 25 is a minimum thickness of the membrane in the energy filter 25. In other words, if the energy of the upper ion beam 10-1 on the left-hand side is E1 then the energy of the upper ion beam 10-1 will have substantially the same value E1 on the right-hand side (with only a small energy loss due stopping power of the membrane which leads to absorption of at least some of the energy of the ion beam 10 in the membrane).

On the other hand, the lower ion beam 10-2 passes through an area $25_{max}$ in which the membrane of the energy filter 25 is at its thickest. The energy E2 of the lower ion beam 10-2 on the left-hand side is absorbed substantially by the energy filter 25 and thus the energy of the lower ion beam 10-2 on the right-hand side is reduced and is lower than the energy of the upper ion beam, i.e. E1>E2. The result is that the more energetic upper ion beam 10-1 is able to penetrate a greater depth in the substrate material 30 than the less energetic lower ion beam 10-2. This results in a differential depth profile in the substrate material 30, which is part of a wafer.

This depth profile is shown on the right-hand side of the FIG. 1. The hashed triangular area shows that the ions penetrate the substrate material at a depth between d1 and d2. The Gaussian curve shows the depth profile without an energy filter 25 and having a maximum value at a depth of d3. It will be appreciated that the depth d3 is larger than the depth d2 since some of the energy of the ion beam 10-1 is absorbed in the energy filter 25.

In the prior art there are a number of principles known for the fabrication of the energy filter 25. Typically, the energy filter 25 will be made from bulk material with the surface of the energy filter 25 etched to produce the desired pattern, such as the triangular cross-sectional pattern known from FIG. 1. In German Patent No DE 10 2016 106 119 B4 (Csato/Krippendorf) an energy filter was described which was manufactured from layers of materials which had different ion beam energy reduction characteristics. The depth profile resulting from the energy filter described in the Csato/Krippendorf patent application depends on the structure of the layers of the material as well as on the structure of the surface.

A further construction principle is shown in the Applicant's co-pending application DE 10 2019 120 623.5, the details of which are incorporated herein by reference, in which the energy filter comprises spaced micro-structured layers which are connected together by vertical walls.

The maximum power from the ion beam 10 that can be absorbed through the energy filter 25 depends on three factors: the effective cooling mechanism of the energy filter 25; the thermo-mechanical properties of the membrane from which the energy filter 25 is made, as well as the choice of material from which the energy filter 25 is made is also relevant. In a typical process, around 50% of the power is absorbed in the energy filter 25, but this can rise to 80% depending on the process conditions.

An example of the energy filter is shown in FIG. 2 in which the energy filter 25 is made of a triangular structured membrane mounted in a frame 27. In one non limiting example the energy filter 25 can be made from a single piece of material, for example, silicon on insulator which comprises an insulating layer silicon dioxide layer 22 having, for example a thickness of 0.2-1 μm sandwiched between a silicon layer 21 (of typical thickness between 2 and 20 μm, but up to 200 μm) and bulk silicon 23 (around 400 μm thick). The structured membrane is made, for example, from silicon, but could also be made from silicon carbide or another carbon-based materials or a ceramic.

In order to optimize the wafer throughput in the ion implantation process for a given ion current for the ion beam 10 and thus use the ion beam 10 efficiently, it is preferred to only irradiate the membrane of the energy filter 25 and not the frame 27 in which the membrane is held in place. In reality, it is likely that at least part of the frame 27 will also be irradiated by the ion beam 10 and thus heat up. It is indeed possible that the frame 27 is completely irradiated. The membrane forming the energy filter 25 is heated up but has a very low thermal conductivity as the membrane is thin (i.e. between 2 $\mu$m and 20 $\mu$m, but up to 200 $\mu$m). The membranes are between 2×2 cm$^2$ and 35×35 cm$^2$ in size and correspond to the size of the wafers. There is little thermal conduction between the membranes and the frame 27. Thus, the monolithic frame 27 does not contribute to the cooling of the membrane and the only cooling mechanism for the membrane which is relevant is the thermal radiation from the membrane.

The localized heating of the membrane in the energy filter 25 results in addition to thermal stress between the heated parts of the membrane forming the energy filter 25 and the frame. Furthermore, the localized heating of the membrane due to absorption of energy from the ion beam 10 in only parts of the membrane also results in thermal stress within the membrane and can lead to mechanical deformation or damage to the membrane 25. The heating of the membrane also occurs within a very short period of time, i.e. less than a second and often in the order of milliseconds. The cooling effect due to non-irradiated parts of the membrane will lead to temperature gradients within the energy filter 25. This cooling effect is particularly noticeable for pulsed ion beams 10 and scanned ion beams 10. These temperature gradients can lead to defects and formation of separate phases within the material from which the membrane of the energy filter 25 is made, and even to unexpected modification of the material (due to the implanted species).

In the past the issue of defects or material modification has been overcome by specifying safe operating conditions for use with a specified maximum ion dose under which this issue does not occur. However, the long-term effects of mechanical deformation and damage to the membrane is not addressed. Should the long-term effects be ignored, this will lead to a change in the profile in the wafer material and thus to wafers that have to be rejected.

There is therefore a need to improve the cooling mechanism for the energy filter as well as the temperature homogenization across the filter and the frame.

SUMMARY OF THE INVENTION

This document teaches an ion implantation device comprising an energy filter in which the energy filter has an additional thermal energy dissipation surface area to enable more efficient cooling of the energy filter.

In one aspect of the ion implantation device, the energy filter comprises a membrane with a first surface and a second surface disposed opposite to the first surface. At least one of the first structure surface or the second surface has a microstructure imposed thereon and forms the additional thermal energy dissipation surface area. The spatial dimensions of the microstructure are between 3-5% of the spatial dimensions of a structure on the first structured surface. However, these dimensions are not limiting of the invention. the microstructure has one of a randomly arranged structure or a structure with a triangular cross-section.

In another aspect of the ion implantation device, the energy filter comprises a plurality of membranes with a further membrane disposed at a distance from a first membrane disposed, for example, between an ion beam source and a substrate material. The ion implantation device may further comprise positioning elements to move the spacing between ones of the plurality of membranes in either a lateral or horizontal direction to enable different depth profiles to be created within the substrate.

In a further aspect, the ion implantation device may further comprise a collimator disposed between one of the first membrane or the further membrane and the substrate material. The collimator absorbs ions in the ion beam that have been scattered at an angle so that the ions reach at positions on the substrate have substantially the same amount of energy and thus penetration depth.

In a further aspect of the ion implantation device, the housing of the ion implantation device further comprises a plurality of conduits for transferring cooling fluid to reduce the heating of and cool down the housing and thus the frame and the membrane of the ion implantation device.

The ion implantation device may also be provided with a plurality of absorber elements in thermal contact with the housing to promote absorption of thermal radiation. These absorber elements are blocking for visible and infra-red light.

DESCRIPTION OF SPECIFIC EMBODIMENTS OF THE INVENTION

The invention will now be described on the basis of the drawings. It will be understood that the aspects of the invention described herein are only examples and do not limit the protective scope of the claims in any way. The invention is defined by the claims and their equivalents. It will be understood that features of one aspect of the invention can be combined with a feature of a different aspect or aspects of the invention.

Figure 1:
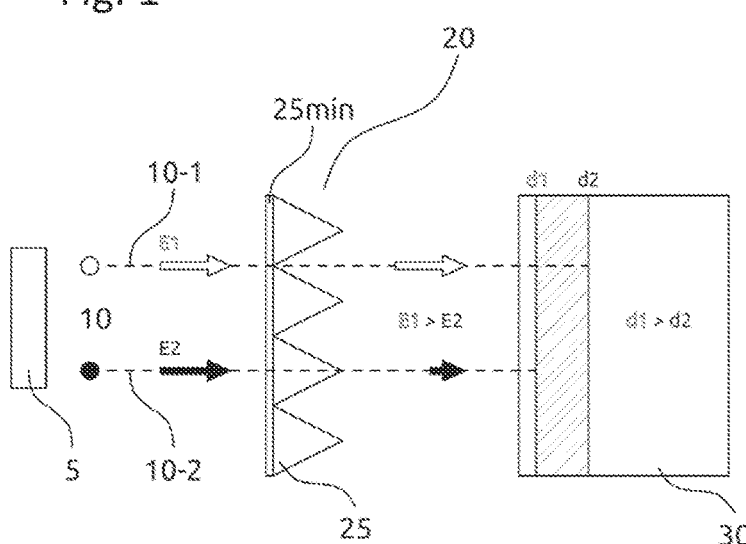
FIG. 1 shows the principle of the ion implantation device with an energy filter as known in the prior art.
Figure 1:
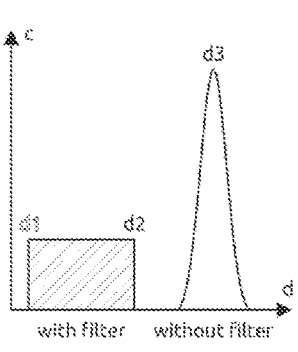
Figure 2:
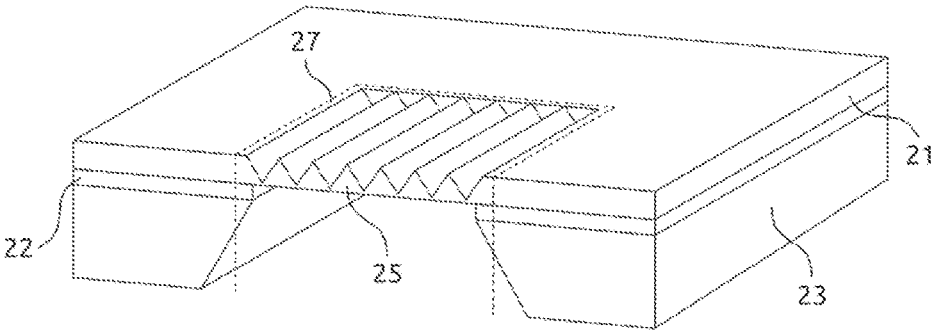
FIG. 2 shows a structure of the ion implantation device with the energy filter.
Figure 3A:
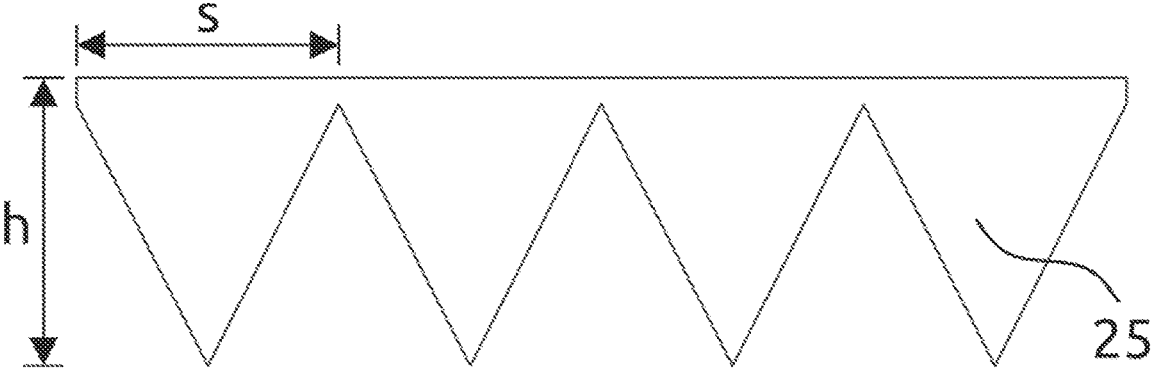
FIGS. 3A, 3B and 3C show the energy filter with a microstructure.
Figure 3B:
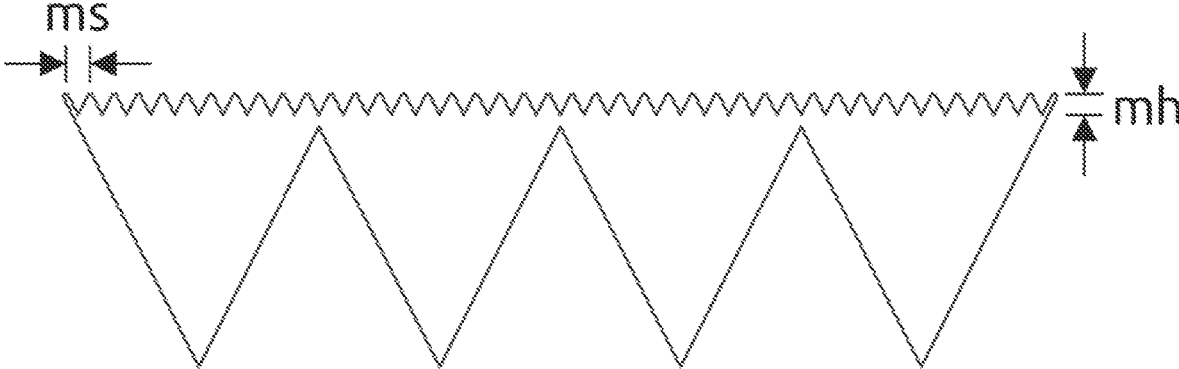
Figure 3C:
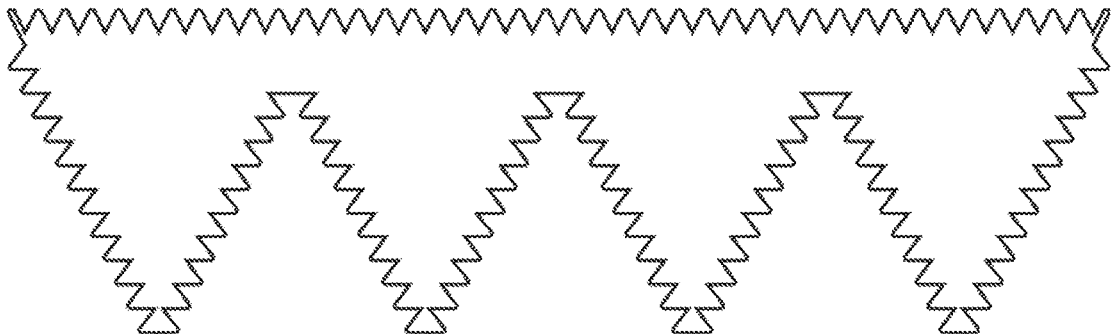

FIG. 3 shows a structure for the membrane of the energy filter 25 according to one aspect of this document. FIG. 3A shows the structured membrane for the energy filter 25 with a triangular cross-section, as known in the art. FIG. 3B shows a microstructure on a surface on one side of the membrane 25 in the energy filter 25 and FIG. 3C shows a microstructure on a surface of both sides of the energy filter 25. In other words, the energy filter 25 has a membrane which in addition to its regular triangular cross-sectional form has an additional microstructure on one or more surfaces.

In the non-limiting example shown in FIG. 3, the height h of the triangular form is 16 $\mu$m and the spacing s is 20 $\mu$m. The energy filter 25 can be made with different dimensions, for example the height can be between 1 $\mu$m and 200 $\mu$m and the spacing between 1 $\mu$m and 400 $\mu$m.

5

The microstructure will affect the energy profile of the ion beams 10 passing through the energy filter 25. Assuming, however, that the energy profile has a tolerance of 3-5%, then the microstructure can have a height (marked as mh on the figure, but not to scale) of 3-5% of the value of the height h and the spacing (marked as ms on the figure, but not to scale) can be 3-5% of the distance of the spacing s. It will, of course, be appreciated that the change in the energy profile will be affected by the microstructure on both sides of the energy filter 20.

The microstructure is created by etching the energy filter 20 from a bulk material or by depositing material on a substrate. There are a number of methods known in the art. For example, a mask can be created on the substate using patterning techniques such as photolithography, e-beam lithography, or laser-beam lithography. The mask is made of a photoresist, silicon dioxide, silicon carbide, chromium, or other materials. Wet chemical etching techniques use, for example, potassium hydroxide, TMAH (tetramethylammonium hydroxide), and other anisotropic etching solutions, plasma-etching techniques, and ion-beam etching.

Self-masking etching techniques can also be used, such as reactive ion etching in a strongly polymerizing process regime or using a potassium hydroxide solution with an additive such as isopropanol.

Self-masking deposition techniques, such as chemical vapor deposition in a selective deposition mode or atomic layer deposition mode can also be used.

Sequential deposition or etching of layers, without masking, is also known. This used femto laser ablation or focused ion beam deposition or removal of material.

It will be appreciated that the creation of the microstructure can be accomplished by mechanically roughing the surface of the surface membrane 25, adding an additional thin layer of materials such as silicon or carbon, or using other techniques such as laser ablation.

It is possible that the structure of the membrane of the energy filter 25 has a different structure and is not in the form with a triangular cross-section. For example, the energy filter 25 could be formed of a series of pyramids, as known in the art. The microstructure would then be placed on the surface of the pyramids.

The effect of the microstructure is to provide a greater surface area to the membrane of the energy filter 25 which enables a greater degree of thermal cooling of the energy filter 25 because of the greater surface area.

Figure 4A:
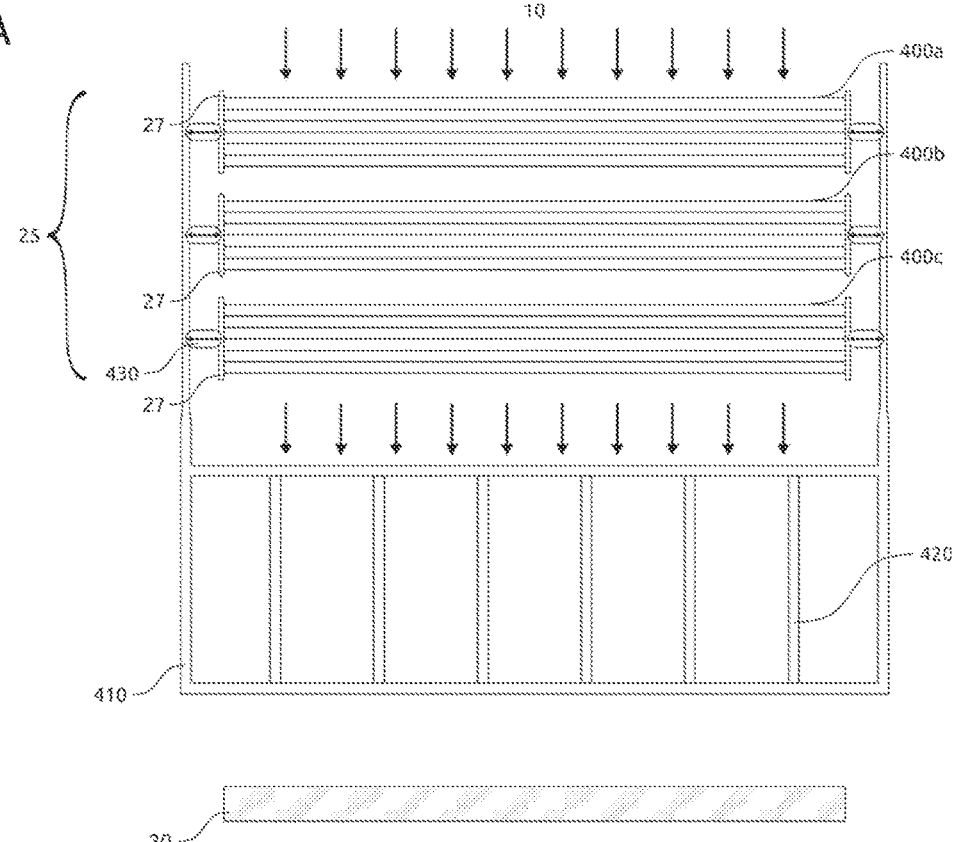
FIGS. 4A and 4B a plurality of membranes in the energy filter as well as open/closed collimation devices.
Figure 4B:
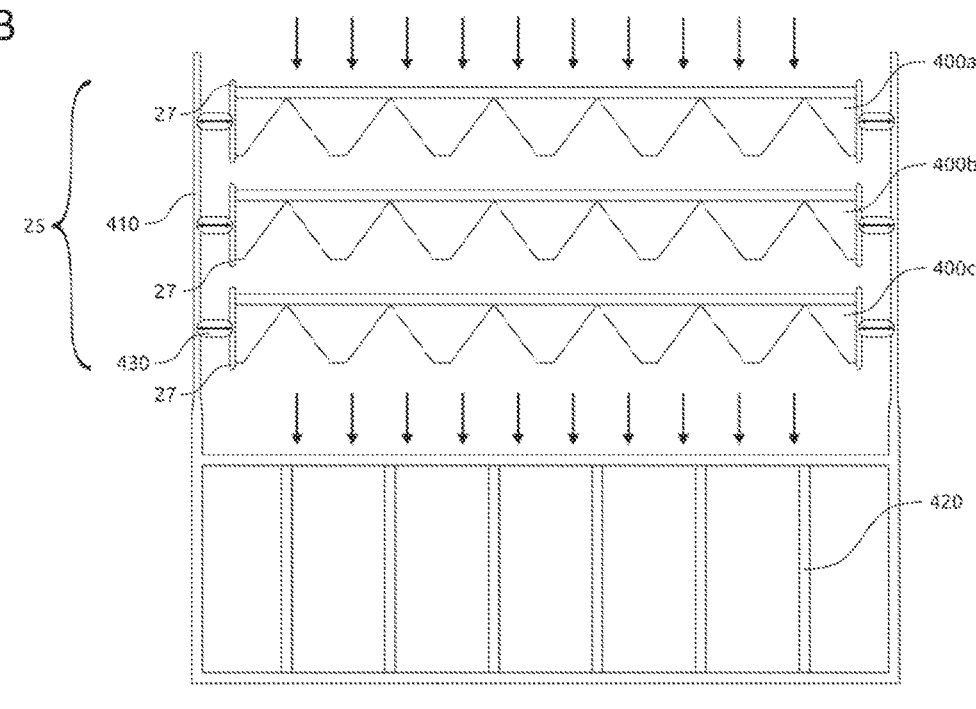

A further aspect of the invention is shown in FIGS. 4A and 4B in which the energy filter 25 comprises a plurality of membranes 400*a-c* mounted in a plurality of frames 27 in a housing 410. The housing 410 can be made of steel with an inner coating of silicon carbide or another carbon material. The inner coating is used to reduce or eliminate contamination of the semiconductor substrates. FIG. 4A shows a plurality of multilayers of the energy filters 25 and FIG. 4B shows energy filters 25 with the triangular cross-sectional film. The membranes of the energy filters 25 could also include the microstructures as shown in FIG. 3.

The plurality of membranes 400*a-c* forming the energy filter 25 are arranged in the housing 410. The plurality of membranes 400*a-c* can be moved in a direction along the direction of the ion beam 10 within the housing 410 to change the spacing between the individual ones of the membranes 400*a-c* and between the membranes 400*a-c* and the substrate material 30. The spacing can be changed both in the vertical and horizontal directions using positioning elements 430, for example, piezoelectric elements or micromotors.

The arrangement of FIGS. 4A and 4B also includes a (optional) collimator 420 to collimate the ion beam 10 after the ion beam 10 has passed through the plurality of the membranes 400*a-c*. The collimator 420 can be open or closed at the ends. It will be appreciated that each ones of the plurality of membranes 400*a-c* each absorb part of the energy of the passing ion beam 10 and thus the membranes 400*a-c* from which the energy filter 25 is made absorb less energy than a single one of the membranes 400*a*, 400*b* or 400*c*. The plurality of membranes 400*a-c* cool through thermal emission.

The arrangement of the energy filter 25 shown in FIGS. 4A and 4B also enable different depth profiles to be created for the ions penetrating the substrate material 30. The plurality of membranes 400*a-c* are shown in FIGS. 4A and 4B as being similar, but each of the plurality of membranes 400*a-c* can have a different profile if required.

Three membranes 400*a-c* are shown in FIG. 4, but it will be appreciated that the number of membranes 400*a-c* can be larger. An increase in the number of membranes 400*a-c* will enable more energy to be dissipated. Suppose the maximum amount of energy that can be dissipated in a single one of the membranes 400*a-c* is 1.6 $W/cm^2$ to avoid damage. If the ion beam 10 has an energy of 10 MeV and it is assumed that 50% of the energy is needed to create the deposition pattern in substrate material 30, then the ion current in the ion beam 10 is around 0.23 $\mu A/cm^2$. With five of the membranes 400*a-c* it is assumed that each one of the membranes 400*a-c* can absorb the same amount of energy, then the maximum ion current will be 1.6 $\mu A/cm^2$.

Figure 5:
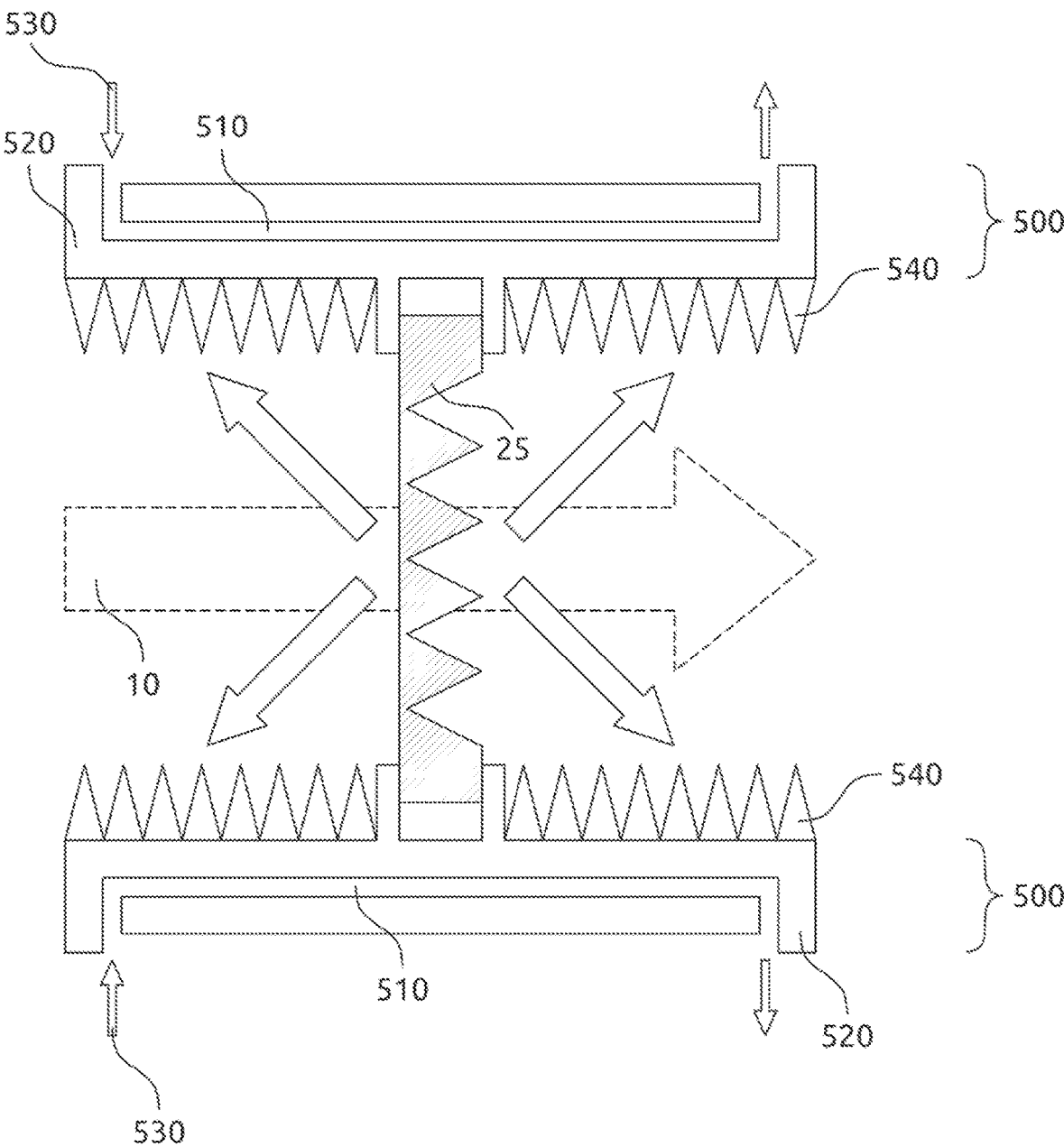
FIG. 5 shows a cooling system for the energy filter.

A further aspect of the invention is shown in FIG. 5 in which an energy filter 25 is mounted in a cooling housing 500. The cooling housing 500 has one or more conduits 510 in the walls 520 of the cooling housing 500 through which a cooling fluid 530. The cooling fluid 530 is, for example, water. The thermal radiation radiated from the energy filter 25 is absorbed by the walls 520 and the heat is then dissipated though the cooling fluid 520.

In a further aspect, the insides of the walls 520 can have absorber elements 540 of, for example, silicon or carbon-based materials and have thicknesses in the micrometer to millimeter region. The absorber elements 540 absorb the radiated thermal energy from the energy filter 25.

REFERENCE NUMERALS

5 Ion beam source
  10 Ion Beam
  20 Ion implementation device
  21 Silicon layer
  22 Silicon dioxide layer
  23 Bulk silicon
  25 Energy Filter
  27 Filter Frame
  30 Substrate material
  400*a-c* Membranes
  410 Housing
  420 Collimator
  430 Positioning elements
  500 Cooling Housing
  510 Conduits
  520 Walls
  530 Cooling fluid
  540 Absorber elements

The invention claimed is:

1. An ion implantation device comprising an energy filter, wherein the energy filter has a thermal energy dissipation surface area, wherein the energy filter comprises a membrane with a first surface and a second surface disposed opposite to the first surface, the first surface being a structured surface, further comprising a housing, wherein the energy filter is mounted in the housing, and a plurality of absorber elements different from the housing, the absorber elements being in thermal contact with the housing and blocking for visible and infra-red light.

2. The ion implantation device of claim 1, wherein the structure of the first surface is one of a structure with a triangular cross-section or is pyramid shaped.

3. The ion implantation device of claim 1, wherein the energy filter is made of a silicon membrane.

4. The ion implantation device of claim 1, wherein the housing further comprises a plurality of conduits for transferring cooling fluid.

5. The ion implantation device of claim 1, further comprising a filter frame, wherein the energy filter is held by the filter frame.

6. The ion implantation device of claim 1, wherein the absorber elements are disposed on a surface perpendicular to a plane of the energy filter.

7. The ion implantation device of claim 1, wherein the absorber elements extend on two sides of the energy filter in a direction perpendicular to a plane of the energy filter.

8. The ion implantation device of claim 7, wherein the absorber elements are adapted to absorb thermal radiation on said two sides of the energy filter.

9. The ion implantation device of claim 1, wherein the absorber elements are adapted to absorb radiated thermal energy from the energy filter.

10. The ion implantation device of claim 5, further comprising an ion beam source adapted to irradiate completely or partially the filter frame with an ion beam.

11. The ion implantation device of claim 1, wherein the housing comprises an inner coating.

12. The ion implantation device of claim 1, wherein the coating comprises a carbon material.

13. The ion implantation device of claim 1, further comprising an ion beam source adapted to irradiate completely or partially the filter frame with an ion beam.

14. The ion implantation device of claim 13, wherein the ion beam source comprises at least one of a cyclotron, a tandem accelerator, and a single-ended-electrostatic accelerator.

15. The ion implantation device of claim 1, wherein an energy of ions of the ion beam source is between 0.5 and 3.0 MeV/nucleon.

16. The ion implantation device of claim 15, wherein the energy of ions of the ion beam source is between 1.0 and 2.0 MeV/nucleon.

17. The ion implantation device of claim 1, wherein a total energy of the ion beam is between 1 and 50 MeV.

18. The ion implantation device of claim 17, wherein the total energy of the ion beam is between 4 and 40 MeV.

19. The ion implantation device of claim 1, wherein ions of the ion beam comprise at least one of aluminum, nitrogen, hydrogen, helium, boron, phosphorous, carbon, arsenic, and vanadium.

20. A housing for an energy filter of an ion implantation device, wherein the housing comprises a plurality of conduits for transferring cooling fluid, wherein the energy filter is mounted in the housing, wherein the housing further comprises a plurality of separate absorber elements in thermal contact with the housing blocking for visible and infra-red light.

* * * * *